United States Patent
Payne et al.

(10) Patent No.: US 9,013,339 B2
(45) Date of Patent: Apr. 21, 2015

(54) TRACK AND HOLD ARCHITECTURE WITH TUNABLE BANDWIDTH

(75) Inventors: Robert F. Payne, Lucas, TX (US); Marco Corsi, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 313 days.

(21) Appl. No.: 13/551,950

(22) Filed: Jul. 18, 2012

(65) Prior Publication Data

US 2013/0015990 A1     Jan. 17, 2013

Related U.S. Application Data

(63) Continuation of application No. 12/857,674, filed on Aug. 17, 2010, now Pat. No. 8,248,282.

(51) Int. Cl.
*H03M 1/00* (2006.01)
*H03M 1/08* (2006.01)
*H03M 1/12* (2006.01)

(52) U.S. Cl.
CPC .............. *H03M 1/08* (2013.01); *H03M 1/1215* (2013.01)

(58) Field of Classification Search
CPC ............................... H03M 1/1215; H03M 1/08
USPC ............ 341/123, 155, 122, 120; 327/390, 93, 327/97, 589, 288
See application file for complete search history.

(56) References Cited

U.S. PATENT DOCUMENTS

| | | | |
|---|---|---|---|
| 5,170,075 A | 12/1992 | de Wit | |
| 5,500,612 A | 3/1996 | Sauer | |
| 5,621,409 A | 4/1997 | Cotter et al. | |
| 6,232,804 B1 | 5/2001 | Shigenbu et al. | |
| 6,243,369 B1 | 6/2001 | Grimwood et al. | |
| 6,255,865 B1 | 7/2001 | Opris | |
| 6,323,697 B1 | 11/2001 | Pavan | |
| 6,489,758 B2 | 12/2002 | Moriconi et al. | |
| 6,541,952 B2 * | 4/2003 | Nagaraj | 324/76.42 |
| 6,724,236 B1 | 4/2004 | Sarraj | |
| 6,977,544 B2 | 12/2005 | Nicollini et al. | |
| 7,292,170 B2 * | 11/2007 | Kinyua et al. | 341/141 |

(Continued)

OTHER PUBLICATIONS

"Bandwidth Mismatch and Its Correction in Time-Interleaved Analog-to-Digital Converters," IEEE Transactions on Circuits and Systems—II: Express Briefs, vol. 53, No. 10, Oct. 2006, pp. 1133-1137 (Tsung-Heng Tsai, Paul J. Hurst, and Stephen H. Lewis).

(Continued)

*Primary Examiner* — Jean B Jeanglaude
(74) *Attorney, Agent, or Firm* — Alan A. R. Cooper; Frank D. Cimino (57) ABSTRACT

To date, bandwidth mismatch within time-interleaved (TI) analog-to-digital converters (ADCs) has been largely ignored because compensation for bandwidth mismatch is performed by digital post-processing, namely finite impulse response filters. However, the lag from digital post-processing is prohibitive in high speed systems, indicating a need for blind mismatch compensation. Even with blind bandwidth mismatch estimation, though, adjustment of the filter characteristics of track-and-hold (T/H) circuits within the TI ADCs can be difficult. Here, a T/H circuit architecture is provided that uses variations of the gate voltage of a sampling switch (which varies the "on" resistance of the sampling switch) to change the bandwidth of the T/H circuits so as to precisely match the bandwidths.

14 Claims, 6 Drawing Sheets

(56) References Cited

U.S. PATENT DOCUMENTS

| | | | |
|---|---|---|---|
| 2002/0105339 A1* | 8/2002 | Nagaraj | 324/601 |
| 2004/0070439 A1 | 4/2004 | Sarraj | |
| 2004/0185809 A1 | 9/2004 | Jenkins | |
| 2004/0239545 A1 | 12/2004 | Tsai et al. | |
| 2006/0224365 A1 | 10/2006 | Pickerd et al. | |
| 2007/0069937 A1 | 3/2007 | Balakrishnan et al. | |
| 2009/0009219 A1 | 1/2009 | Mathur et al. | |
| 2010/0182174 A1 | 7/2010 | Johansson et al. | |

OTHER PUBLICATIONS

"A 1.5-V, 10-bit, 14.3-MS/s CMOS Pipeline Analog-to-Digital Converter," IEEE Journal of Solid-State Circuits, vol. 34, No, 5, May 1999, pp. 599-606 (Andrew M. Abo and Paul R. Gray).

"Bandwidth Mismatch Correction for a Two-Channel Time-Interleaved A/D Converer" Proceedings of 2007 IEEe , International Symposium on Circuits and Systems, pp. 1705-1708 (Patrick Satarzadeh, Bernard C. Levy, Paul J. Hurst).

PCT Search Report mailed Feb. 17, 2012 from parent.

* cited by examiner

TRACK AND HOLD ARCHITECTURE WITH TUNABLE BANDWIDTH

CROSS-REFERENCE TO RELATED APPLICATIONS

This application is a continuation of U.S. patent application Ser. No. 12/857,674, filed Aug. 17, 2010, which is hereby incorporated by reference for all purposes.

TECHNICAL FIELD

The invention relates generally to analog-to-digital converters (ADCs) and, more particularly, to time-interleaved (TI) ADCs.

BACKGROUND

Figure 1:
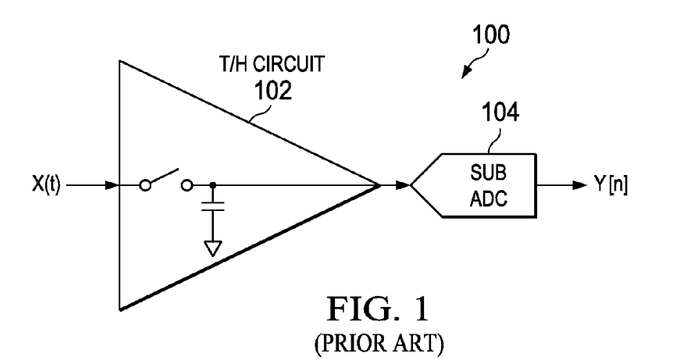
FIG. 1 is a circuit diagram of a conventional ADC.

Referring to FIG. 1 of the drawings, the reference numeral 100 generally designates a conventional ADC. ADC 100 generally comprises a track-and-hold (T/H) circuit 102 and a sub-ADC 104 so that, in operation, the ADC 100 can sample an analog input signal X(t) at a plurality of sampling instants and convert the sampled signal into a digital signal Y[n]. As is shown in FIG. 1, though, the T/H circuit 104 generally comprises switches and capacitors. The switch has a non-zero resistance, which causes the T/H circuit 102 to function as a filter (typically a single pole low pass filter).

Figure 2:
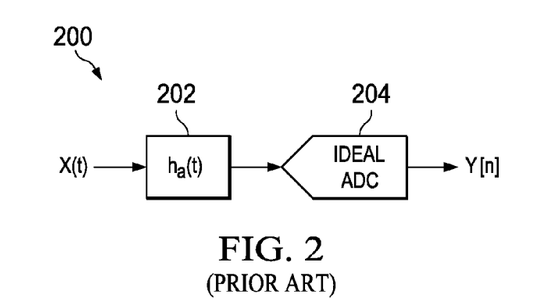
FIG. 2 is a block diagram of a model of the ADC of FIG. 1.

Turning to FIG. 2, a model 200 of the ADC 100 is shown. In model 200, the filter aspects of the ADC 100 are represented by filter 202, while the remainder of the functionality of the ADC 100 is represented by ideal ADC 204. Filter 202 has a transfer function in the time-domain of $h_a(t)$, which can, in turn, be represented in the frequency-domain as:

$$H_a(\omega) = \frac{g_a e^{i\omega \Delta t}}{1 + i\left(\frac{\omega}{\omega_a}\right)}, \quad (1)$$

where $g_a$ is the gain of ADC 100, $\Delta t_a$ is the time delay relative to a reference, and $\omega_a$ is the cutoff frequency (bandwidth). This model 200 can be useful when determining mismatches for TI ADCs.

Figure 3A:
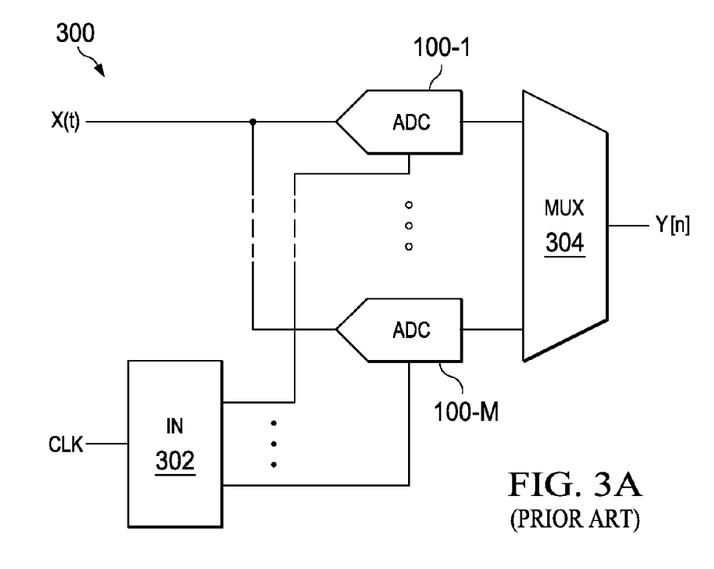
FIG. 3A is a circuit diagram of a convention TI ADC using the ADC of FIG. 1.

In FIG. 3A, an example of a TI ADC 300 can be seen. TI ADC 300 generally comprises ADCs 100-1 to 100-M (where each of ADCs 100-1 to 100-M generally has the same structure as ADC 100 from FIG. 1) that are clocked by divider 302 so that the outputs from ADCs 100-1 to 100-M can be multiplexed by multiplexer 304 to produce digital signal Y[n]. Yet, when building TI ADC 300, ADCs 100-1 to 100-M are not identical to each other; there are slight structural and operational variations. These slight variations result in Direct Current (DC) offset mismatches, timing skew, gain mismatches, and bandwidth mismatches between ADCs 100-1 to 100-M.

Of the different types of mismatches listed, the performance impact, as the result of bandwidth mismatches, are the weakest, and, to date, have largely been ignored, but, in order to build a high accuracy (generally greater than 6 bits), high speed (generally greater than 1 GS/s) TI ADCs, bandwidth mismatches between interleaved ADC branches need to be corrected. Looking to TI ADC 300, the output spectrum when the input signal is a tone with frequency $\omega_*$ can be represented as follows:

$$Y(e^{i\omega}) = \sum_{k=0}^{M-1}\left(\frac{1}{M}\sum_{a=0}^{M-1}H_a(\omega_*)e^{-i\frac{2\pi k}{M}a}\right)\delta\left(\omega - \omega_* - \frac{2\pi k}{M}\right). \quad (2)$$

Assuming a 2-way TI ADC (M=2), which generally represents the upper-bound or worst-case for bandwidth mismatch, equation (2) can be reduced to:

$$Y(e^{i\omega}) = \left(\frac{H_0(\omega_0) + H_1(\omega_0)}{2}\right)X(e^{i\omega}) + \left(\frac{H_0(\omega_0) + H_1(\omega_0)}{2}\right)X(e^{i(\omega-\pi)}) \quad (3)$$

with a Spurious-Free Dynamic Range (SFDR) of $$SFDR = 20\log_{10}\left(\frac{H_0(\omega_0) + H_1(\omega_0)}{H_0(\omega_0) - H_1(\omega_0)}\right) \quad (4)$$

The SFDR for an M-way interleaved TI ADC, therefore, can then be determined to be:

$$SFDR = \max_k\left(20\log_{10}\left(\frac{A[0]}{A[k]}\right)\right) \quad (5)$$

where $$A[k] = \sum_{a=0}^{M-1} H_a(\omega_0)e^{-i\frac{2\pi k}{M}a} \quad (6)$$

Figure 3B:
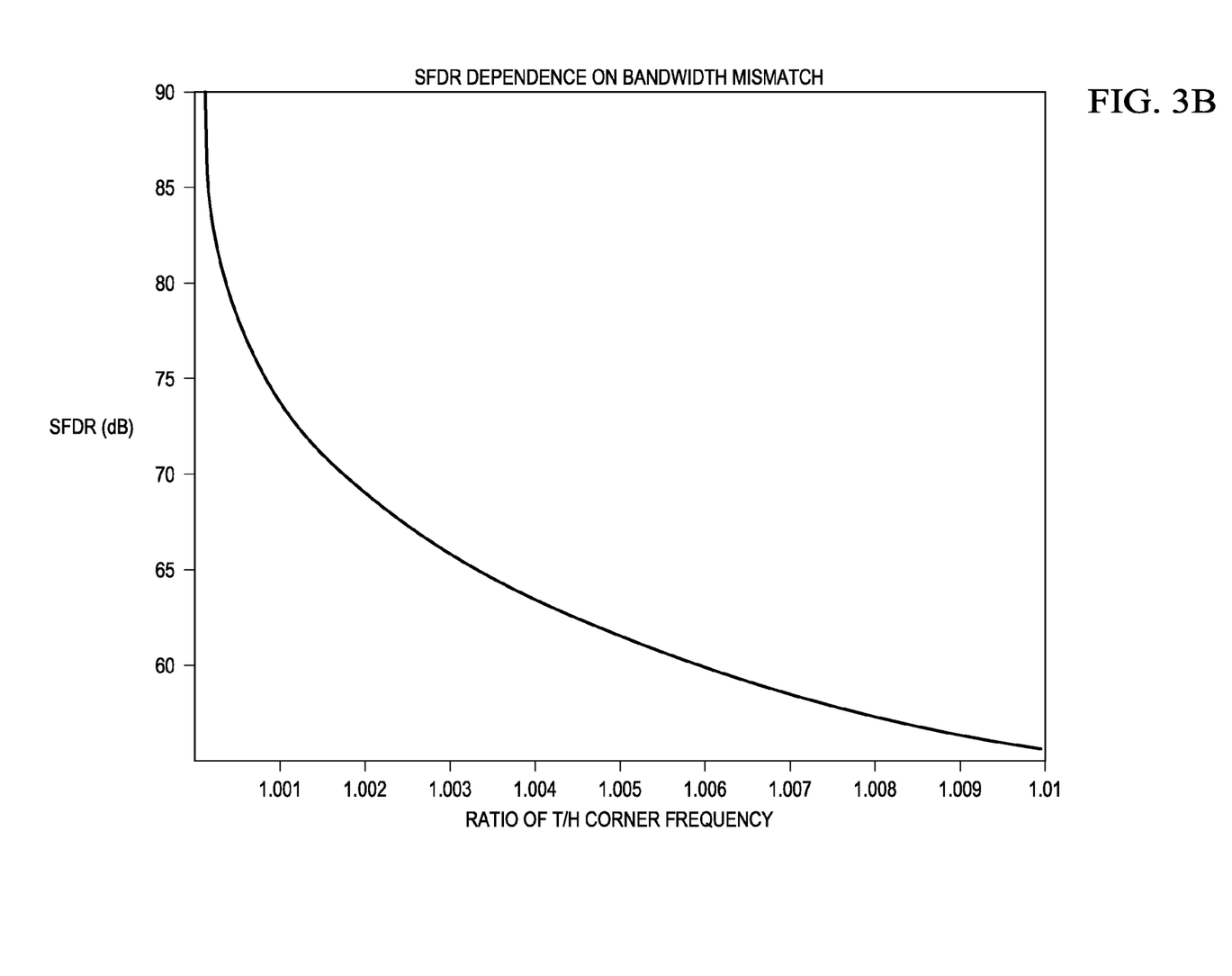
FIG. 3B is an example of a simulation showing the effect of bandwidth mismatch on the Spurious-Free Dynamic Range (SFDR) of a TI ADC.

Now, equation (1) can be applied to TI ADC 300 for the purposes of simulation so $$H_a(\omega_0) = \frac{1}{1 + i\tau_a\omega_0}, \quad (7)$$

$$\text{for } T_S > \tau_a = \frac{1}{\omega_a},$$

where $T_S$ is the period of clock signal CLK. Such a simulation yields that variations in bandwidth mismatches are dependent on gain mismatches and timing skews and that (with high accuracy, high speed TI ADCs) bandwidth mismatch can significantly affect performance. An example of a simulation of the effect bandwidth mismatch can be seen in FIG. 3B for different gain and skew compensations. Thus, to achieve the desired SFDR (i.e., greater than 70 dB) for a TI ADC, the bandwidths of ADCs within the TI ADC should be matched to be within 0.1% to 0.25%.

To date, however, no estimation algorithm or circuit exists to blindly determine bandwidth mismatches. The two most relevant conventional circuits, though, are described in the following: Satarzadeh et al., "Bandwidth Mismatch Correction for a Two-Channel Time-Interleaved A/D Converter," *Proceedings of 2007 IEEE International Symposium on Circuits and Systems*, 2007; and Tsai et al., "Bandwidth Mismatch and Its Correction in Time-Interleaved Analog-to-Digital Converters," *IEEE Transactions on Circuits and Systems II: Express Briefs*, Vol. 53, No. 10, pp. 1133-1137, Oct. 23, 2006. Neither of these circuits, though, adequately addresses blind bandwidth mismatch estimation.

Assuming, however, that one is able to adequately perform blind bandwidth mismatch estimation, adjustment of bandwidths of the T/H circuits (like T/H circuit 102) in TI ADC 300 can be difficult due at least in part to the precision of the bandwidth matching. A switched capacitor arrangement included within the T/H circuit 102 would be undesirable because it would be difficult to implement, and capacitive tuning (such as with a varactor and a tuning voltage) would also be undesirable because of signal dependencies. Thus, there is a need for a bandwidth adjustment circuit that can be adjusted from a blind bandwidth mismatch estimation.

Some other conventional circuits are: U.S. Pat. No. 5,500, 612; U.S. Pat. No. 6,232,804; U.S. Pat. No. 6,255,865; U.S. Patent Pre-Grant Publ. No. 2004/0070439; U.S. Patent Pre-Grant Publ. No. 2004/0239545; U.S. Patent Pre-Grant Publ. No. 2009/0009219; and Abo et al. "A 1.5-V, 10-bit, 14.3-MS/s CMOS Pipeline Analog-to-Digital Converter," *IEEE J. of Solid State Circuits*, Vol. 34, No. 5, pp. 599-606, May 1999;

SUMMARY

A preferred embodiment of the present invention, accordingly, provides an apparatus. The apparatus comprises a clock divider that receives a clock signal; a plurality analog-to-digital converter (ADC) branches that each receive an analog input signal, wherein each ADC branch includes: a delay circuit that is coupled to the clock divider; an ADC having: a bootstrap circuit that is coupled to the delay circuit; a sampling switch that is coupled to the bootstrap circuit; and a controller that is coupled to the bootstrap circuit to provide a control voltage to the bootstrap circuit so as to control a gate voltage of the sampling switch to adjust the impedance of the sampling switch when the sampling switch is actuated; a sampling capacitor that is coupled to the sampling switch; and a correction circuit that is coupled to the ADC; and a mismatch estimation circuit that is coupled to each delay circuit, each correction circuit, and each controller, wherein the mismatch estimation circuit provides a control signal to each controller to adjust for relative bandwidth mismatches between the ADC branches.

In accordance with a preferred embodiment of the present invention, the apparatus further comprises a multiplexer that is coupled to each ADC branch.

In accordance with a preferred embodiment of the present invention, the correction circuit adjusts the output of its ADC to correct for DC offset and gain mismatch.

In accordance with a preferred embodiment of the present invention, the bootstrap circuit further comprises: a boost capacitor that is charged during a hold phase of the ADC; a transistor having first passive electrode, a second passive electrode, and a control electrode, wherein the first passive electrode of the transistor is coupled to the boost capacitor, and wherein the second passive electrode of the transistor is coupled to the sampling switch; a passgate circuit that is coupled to the delay circuit, that is coupled to the control electrode of the transistor, and that receives the control voltage; and a skew circuit that is coupled to sampling switch and that is controlled by the control voltage.

In accordance with a preferred embodiment of the present invention, the transistor further comprises a first transistor, and wherein the passgate circuit further comprises: a second transistor having a first passive electrode, a second passive electrode, and a control electrode, wherein the first passive electrode of the second transistor is coupled to the controller so as to receive the control voltage, and wherein the control electrode of the second transistor is coupled to the delay circuit, and wherein the second passive electrode of the second transistor is coupled to the control electrode of the first transistor; a third transistor having a first passive electrode, a second passive electrode, and a control electrode, wherein the first passive electrode of the third transistor is coupled to the second passive electrode of second transistor, and wherein the control electrode of the third transistor is coupled to the delay circuit; and a fourth transistor having a first passive electrode, a second passive electrode, and a control electrode, wherein the first passive electrode of the fourth transistor is coupled to the control electrode of the first transistor, and wherein the control electrode of the fourth transistor is coupled to the sampling switch, and wherein the second passive electrode of the fourth transistor is coupled to the second passive electrode of the third transistor.

In accordance with a preferred embodiment of the present invention, the skew circuit further comprises a fifth transistor having a first passive electrode, a second passive electrode, and a control electrode, wherein the first passive electrode of the fifth transistor is coupled to the sampling switch, and wherein the control electrode of the fifth transistor is coupled to the controller so as to receive the control voltage.

In accordance with a preferred embodiment of the present invention, the controller is a digital-to-analog converter (DAC).

In accordance with a preferred embodiment of the present invention, the controller is a charge pump.

In accordance with a preferred embodiment of the present invention, an apparatus comprising a clock divider that receives a clock signal; a plurality ADC branches that each receive an analog input signal, wherein each ADC branch includes: a delay circuit that is coupled to the clock divider; an ADC having: a bootstrap circuit that is coupled to the delay circuit; a sampling switch that is coupled to the bootstrap circuit; a controller that is coupled to the bootstrap circuit to provide a control voltage to the bootstrap circuit so as to control a gate voltage of the sampling switch to adjust the impedance of the sampling switch when the sampling switch is actuated; a sampling capacitor that is coupled to the sampling switch; an output circuit that is coupled to the sampling capacitor; and a sub-ADC that is coupled to the output circuit; and an correction circuit that is coupled to the ADC; a mismatch estimation circuit that is coupled to each delay circuit, each correction circuit, and each controller, wherein the mismatch estimation circuit provides a control signal to each controller to adjust for relative bandwidth mismatches between the ADC branches; and a multiplexer that is coupled to each ADC branch.

In accordance with a preferred embodiment of the present invention, an apparatus is provided. The apparatus comprises a clock divider that receives a clock signal; a plurality ADC branches that each receive an analog input signal, wherein each ADC branch includes: a delay circuit that is coupled to the clock divider; an ADC having: a bootstrap circuit that is coupled to the delay circuit; a PMOS transistor that is coupled to the bootstrap circuit; a controller that is coupled to the bootstrap circuit to provide a control voltage to the bootstrap circuit so as to control a gate voltage of the sampling switch to adjust the impedance of the sampling switch when the sampling switch is actuated; a sampling capacitor that is coupled to the PMOS transistor at its drain; an output circuit that is coupled to the sampling capacitor; and a sub-ADC that is coupled to the output circuit; and an correction circuit that is coupled to the ADC, wherein the correction circuit adjusts the output of its ADC to correct for DC offset and gain mismatch; a mismatch estimation circuit that is coupled to each delay circuit, each correction circuit, and each controller, wherein the mismatch estimation circuit provides a control signal to each controller to adjust for relative bandwidth mismatches between the ADC branches; and a multiplexer that is coupled to each ADC branch.

In accordance with a preferred embodiment of the present invention, the PMOS transistor further comprises a first PMOS transistor, and wherein the bootstrap circuit further comprises: a boost capacitor that is charged during a hold phase of the ADC; a second PMOS transistor that is coupled to the boost capacitor at its source and the gate of the first PMOS switch at its drain; a passgate circuit that is coupled to the delay circuit, that is coupled to the gate of the second PMOS transistor, and that receives the control voltage; and a skew circuit that is coupled to sampling switch and that is controlled by the control voltage.

In accordance with a preferred embodiment of the present invention, the passgate circuit further comprises: a third PMOS transistor that is coupled to the controller at its source, the delay circuit at its gate, and the gate of the second PMOS transistor at its drain; a first NMOS transistor that is coupled to the drain of the third PMOS transistor at its drain and the delay circuit at its gate; and a second NMOS transistor that is coupled to the drain of the third PMOS transistor at its drain, the source of the first NMOS transistor at its source, and the gate of the first PMOS transistor at its gate.

In accordance with a preferred embodiment of the present invention, the skew circuit further comprises a third NMOS transistor that is coupled to the gate of the first PMOS transistor at its drain and the controller at its gate.

In accordance with a preferred embodiment of the present invention, the controller is a DAC or a charge pump.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Refer now to the drawings wherein depicted elements are, for the sake of clarity, not necessarily shown to scale and wherein like or similar elements are designated by the same reference numeral through the several views.

Figure 4:
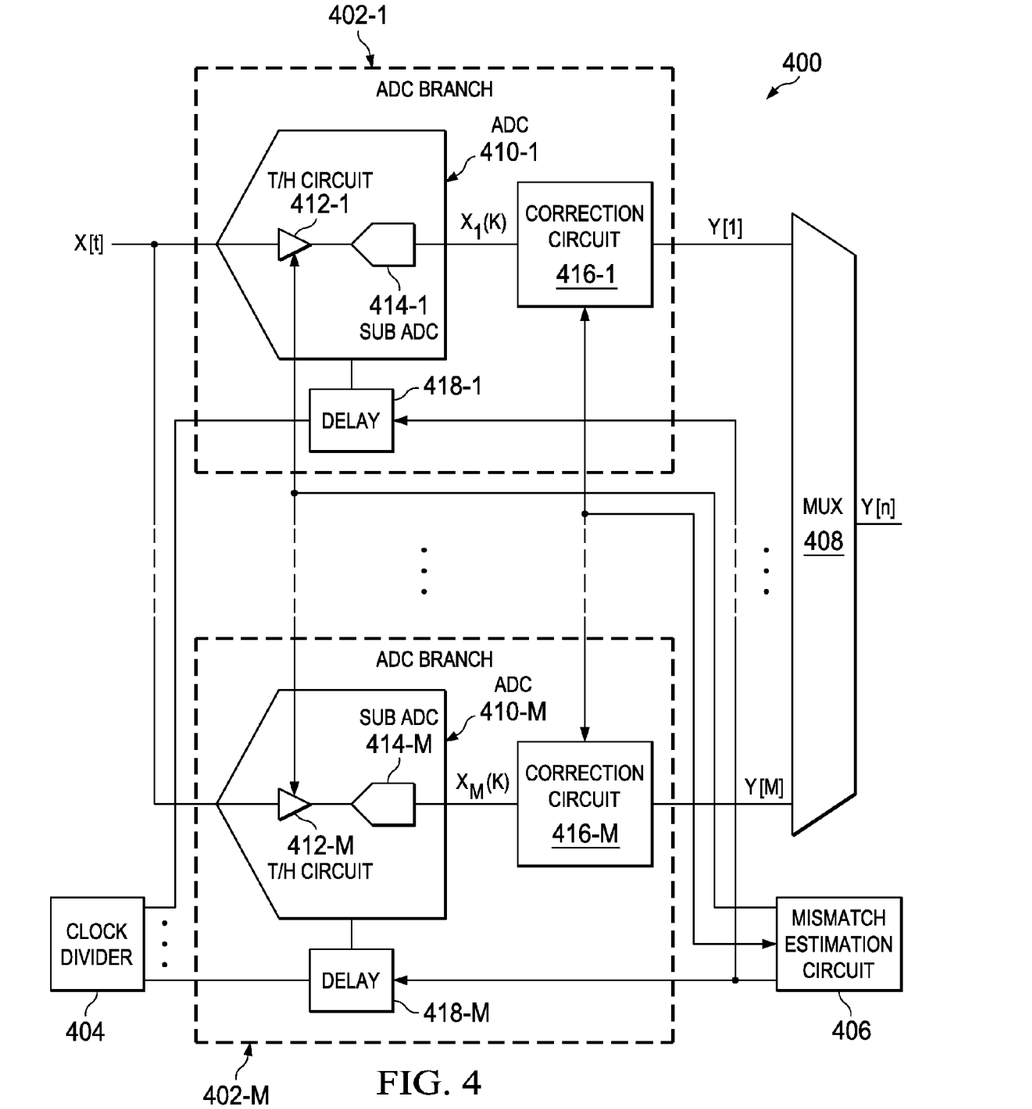
FIG. 4 is a circuit diagram of a TI ADC in accordance with a preferred embodiment of the present invention.

Referring to FIG. 4 of the drawings, the reference numeral 400 generally designates a TI ADC in accordance with a preferred embodiment of the present invention. ADC 400 generally comprises ADC branches 402-1 to 402-M, divider 404, multiplexer or mux 408, and a mismatch estimation circuit 410. Each ADC branch 402-1 to 402-M also generally comprises (respectively) ADC 410-1 to 410-M, correction circuit 416-1 to 416-M, and adjustable delay element or circuit 418-1 to 418-M. Additionally, each ADC 410-1 to 410-M generally comprises (respectively) a T/H circuit 410-1 to 410-M and a sub-ADC 414-1 to 414-M.

In operation, TI ADC 400 converts analog input signal X(t) to a digital signal Y[n]. To accomplish this, divider 402 divides a clock signal CLK (with a frequency of $F_S$ or period of $T_S$) into M clock signals (each with a frequency of $F_S/M$) that are staggered by delay circuits 418-1 to 418-M and provided to ADCs 410-1 to 410-M. This allows each of ADCs 410-1 to 410-M to convert the analog signal X(t) to digital signals $X_1(k)$ to $X_M(k)$. The gain and DC offset adjustments are applied to digital signals $X_1(k)$ to $X_M(k)$ by correction circuits 416-1 to 416-M to generate digital signals Y[1] to Y[M], which can then be multiplexed by mux 408 to generate a digital signal Y[N].

To generally ensure that signals Y[0] to Y[M−1] are matched, mismatch estimation circuit 410 calculates and compensates for gain mismatches, DC offset mismatches, timing skews, and bandwidth mismatches. The mismatch estimation circuit 410 is generally a digital signals processor (DSP) or dedicated hardware, which determines the gain mismatches, DC offset mismatches, timing skews, and bandwidth mismatches and which can provide adjustments for gain, DC offset, timing skew, and bandwidth to correction circuits 416-1 to 416-M and T/H circuits 412-1 to 412-M. A more complete explanation of the mismatch estimation circuit 410 can be found in co-pending U.S. patent application Ser. No. 12/572,831, which is entitled "BANDWIDTH MISMATCH ESTIMATION IN TIME-INTERLEAVED ANALOG-TO-DIGITAL CONVERTERS," and which is incorporated by reference for all purposes.

Figure 5:
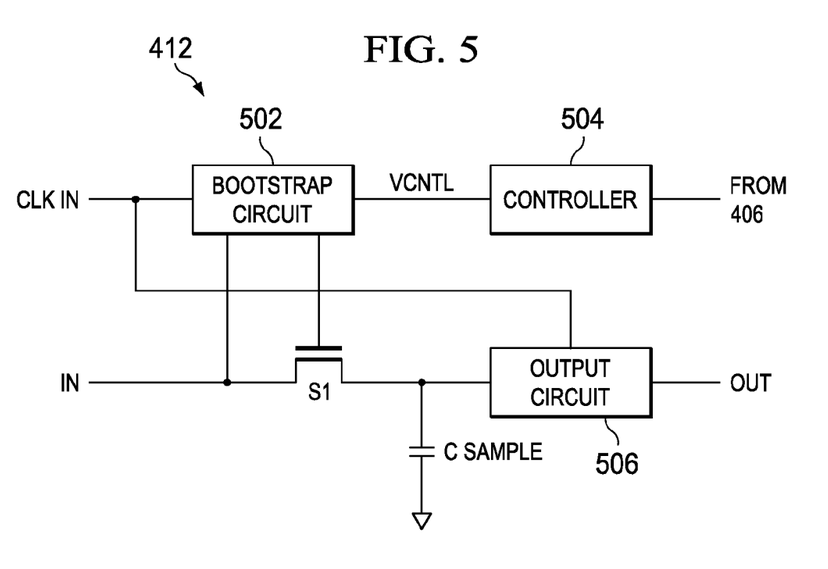
FIG. 5 is a circuit diagram of the T/H circuit of FIG. 4.

Turning now to FIG. 5, T/H circuits 412-1 to 412-M (hereinafter referred to as 412 for the sake of simplicity) can be seen in greater detail. T/H circuit 412 generally comprises a bootstrap circuit 502, a controller 504, a sampling switch S1 (which is typically an NMOS transistor or NMOS switch), a sampling capacitor CSAMPLE, and an output circuit 506. In operation, the bootstrap circuit 502 controls the actuation and de-actuation of the sampling switch S1 based at least in part on a clock signal CLKIN (which is received from a respective delay circuit 418-1 to 418-M) and a control voltage VCNTL from controller 504. Generally, the mismatch estimation circuit 406 provides a control signal to the controller 504 (which may be a digital-to-analog converter (DAC) or charge pump) to generate the control voltage VCNTL. The control voltage VCNTL, through the bootstrap circuit 502, is able to control the gate voltage of the sampling switch S1 to adjust the impedance or "on" resistance of the sampling switch S1 when the sampling switch S1 is actuated.

Figure 6:
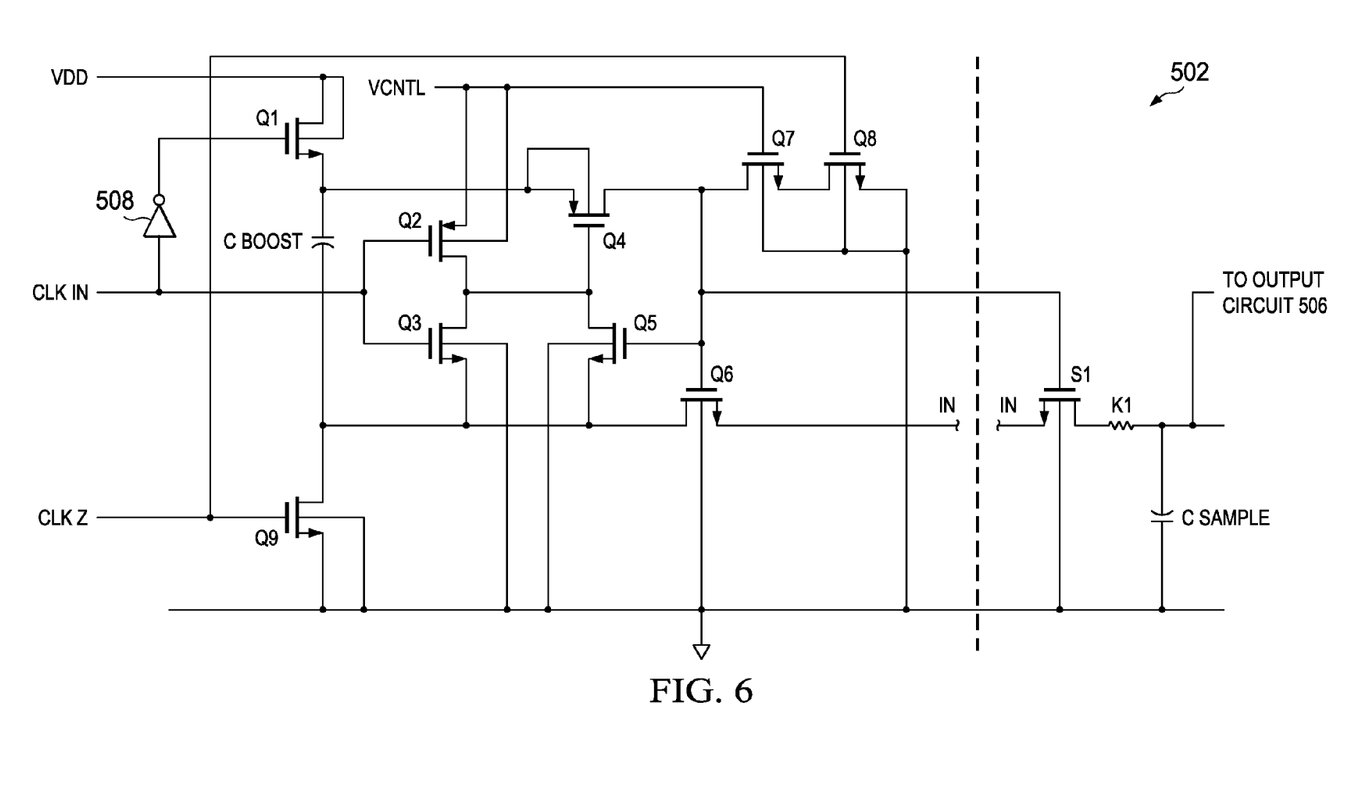
FIG. 6 is a circuit diagram of the bootstrap circuit of 5.

Looking to FIG. 6, the bootstrap circuit 502 can be seen in greater detail. When the clock signal CLKIN is logic low (such as during a hold phase), inverter 508 turns transistor Q1 (which is typically an NMOS transistor) "on," while passgate circuit (which generally comprises transistors Q2, Q3, and Q5) maintains transistor Q4 (which is generally a PMOS transistor) in an "off" state. Assuming that signal CLKZ is logic high so that transistors Q8 and Q9 (which are typically NMOS transistors) are in an "on" state and during this logic low period of clock signal CLKIN, supply voltage VDD charges the boost capacitor CBOOST. When clock signal CLKIN transitions to logic high, passgate circuit turns transistor Q4 "on," while transistors Q1 is turned "off." At this point, a voltage is applied to the gate of sampling switch S1 to turn it "on." This gate voltage for sampling switch S1 is generated at least in part from the discharge of capacitor CBOOST, the input signal IN (which is applied through transistor Q6), and the control voltage VCNTL (which is applied through the passgate circuit and the skew circuit (which generally comprises transistors Q7 and Q8)). Generally, this control voltage VCNTL is applied to the source of transistor Q2 (which is generally a PMOS transistor) and the gate of transistor Q7 (which is generally an NMOS transistor) so as to adjust the gate voltage of sample switch S1. Thus, the gate voltage of the sampling switch S1 can be easily controlled by varying control voltage VCNTL. Additionally, because the sampling switch S1 is generally a NMOS switch operating in a linear region, variation of this gate voltage varies the "on" resistance of the sampling switch S1, which adjusts the filter characteristics (and bandwidth) of the filter created by the sampling switch S1, resistor R1, and sampling capacitor CSAMPLE.

Figure 7:
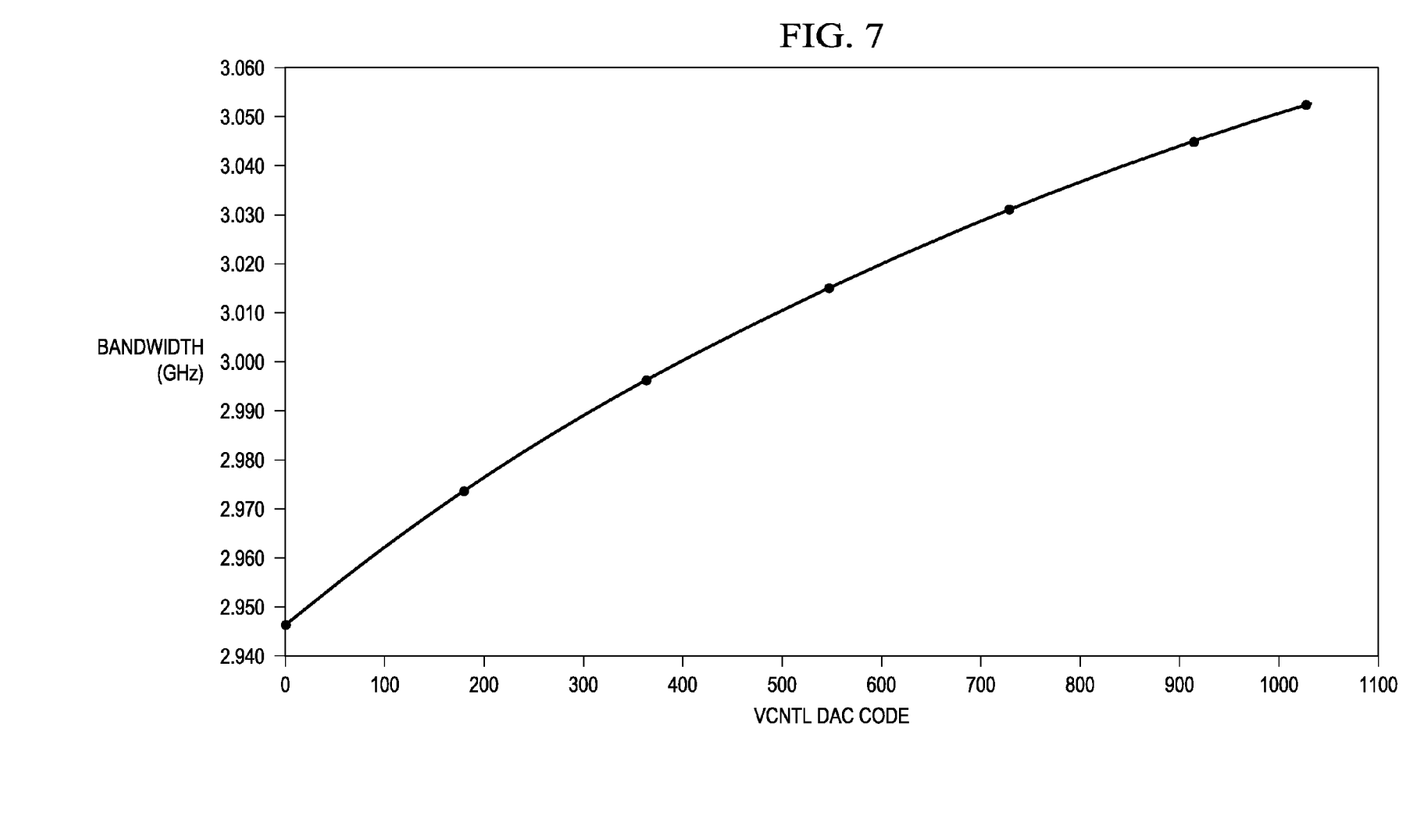
FIG. 7 is a graph depicting the bandwidth for the T/H circuit of FIG. 5 versus "on" resistance of the sampling switch of the T/H circuit of FIG. 5.

To illustrate the operation to bootstrap circuit 502 and sampling switch S1, a graph depicting bandwidth of T/H circuit 412 versus "on" resistance for the sampling switch S1 can be seen in FIG. 7. As can be seen, the bandwidth for T/H circuit 502 varies between about 2.956 GHz at for a VCNTL DAC code of zero to about 3.051 GHz for a VCNTL DAC code of 1023Ω. Thus, the bandwidths for multiple T/H circuits 412 (such as 412-1 to 412-M) with nominal bandwidths of 3 GHz can be adjusted to match one another to between about 0.25% and about 0.1%.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:
1. An apparatus comprising:
a clock divider that receives a clock signal;
a plurality analog-to-digital converter (ADC) branches that each receive an analog input signal, wherein each ADC branch includes:
a delay circuit that is coupled to the clock divider;
an ADC having:
a bootstrap circuit that is coupled to the delay circuit;
a sampling switch that is coupled to the bootstrap circuit; and
a controller that is coupled to the bootstrap circuit to provide a control voltage to the bootstrap circuit so as to control a gate voltage of the sampling switch to adjust the impedance of the sampling switch when the sampling switch is actuated;
a sampling capacitor that is coupled to the sampling switch; and
a correction circuit that is coupled to the ADC; and
a mismatch estimation circuit that is coupled to each delay circuit, each correction circuit, and each controller, wherein the mismatch estimation circuit provides a control signal to each controller to adjust for relative bandwidth mismatches between the ADC branches,
wherein the apparatus further comprises a multiplexer that is coupled to each ADC branch;
wherein the correction circuit adjusts the output of its ADC to correct for DC offset and gain mismatch wherein the bootstrap circuit further comprises:
a boost capacitor that is charged during a hold phase of the ADC;
a transistor having first passive electrode, a second passive electrode, and a control electrode, wherein the first passive electrode of the transistor is coupled to the boost capacitor, and wherein the second passive electrode of the transistor is coupled to the sampling switch;
a passgate circuit that is coupled to the delay circuit, that is coupled to the control electrode of the transistor, and that receives the control voltage; and
a skew circuit that is coupled to sampling switch and that is controlled by the control voltage.

2. The apparatus of claim 1, wherein the transistor further comprises a first transistor, and wherein the passgate circuit further comprises:
a second transistor having a first passive electrode, a second passive electrode, and a control electrode, wherein the first passive electrode of the second transistor is coupled to the controller so as to receive the control voltage, and wherein the control electrode of the second transistor is coupled to the delay circuit, and wherein the second passive electrode of the second transistor is coupled to the control electrode of the first transistor;
a third transistor having a first passive electrode, a second passive electrode, and a control electrode, wherein the first passive electrode of the third transistor is coupled to the second passive electrode of second transistor, and wherein the control electrode of the third transistor is coupled to the delay circuit; and
a fourth transistor having a first passive electrode, a second passive electrode, and a control electrode, wherein the first passive electrode of the fourth transistor is coupled to the control electrode of the first transistor, and wherein the control electrode of the fourth transistor is coupled to the sampling switch, and wherein the second passive electrode of the fourth transistor is coupled to the second passive electrode of the third transistor.

3. The apparatus of claim 2, wherein the skew circuit further comprises a fifth transistor having a first passive electrode, a second passive electrode, and a control electrode, wherein the first passive electrode of the fifth transistor is coupled to the sampling switch, and wherein the control electrode of the fifth transistor is coupled to the controller so as to receive the control voltage.

4. The apparatus of claim 3, wherein the controller is a digital-to-analog converter (DAC).

5. The apparatus of claim 3, wherein the controller is a charge pump.

6. An apparatus comprising:
a clock divider that receives a clock signal;
a plurality ADC branches that each receive an analog input signal, wherein each ADC branch includes:
a delay circuit that is coupled to the clock divider;
an ADC having:
a bootstrap circuit that is coupled to the delay circuit;
a sampling switch that is coupled to the bootstrap circuit;
a controller that is coupled to the bootstrap circuit to provide a control voltage to the bootstrap circuit so as to control a gate voltage of the sampling switch to adjust the impedance of the sampling switch when the sampling switch is actuated;
a sampling capacitor that is coupled to the sampling switch;
an output circuit that is coupled to the sampling capacitor; and
a sub-ADC that is coupled to the output circuit; and
a correction circuit that is coupled to the ADC;
a mismatch estimation circuit that is coupled to each delay circuit, each correction circuit, and each controller, wherein the mismatch estimation circuit provides a control signal to each controller to adjust for relative bandwidth mismatches between the ADC branches; and
a multiplexer that is coupled to each ADC branch,
wherein the correction circuit adjusts the output of its ADC to correct for DC offset and gain mismatch,
wherein the bootstrap circuit further comprises:
a boost capacitor that is charged during a hold phase of the ADC;
a transistor having first passive electrode, a second passive electrode, and a control electrode, wherein the first passive electrode of the transistor is coupled to the boost capacitor, and wherein the second passive electrode of the transistor is coupled to the sampling switch;
a passgate circuit that is coupled to the delay circuit, that is coupled to the control electrode of the transistor, and that receives the control voltage; and
a skew circuit that is coupled to sampling switch and that is controlled by the control voltage.

7. The apparatus of claim 6, wherein the transistor further comprises a first transistor, and wherein the passgate circuit further comprises:
a second transistor having a first passive electrode, a second passive electrode, and a control electrode, wherein the first passive electrode of the second transistor is coupled to the controller so as to receive the control voltage, and wherein the control electrode of the second transistor is coupled to the delay circuit, and wherein the second passive electrode of the second transistor is coupled to the control electrode of the first transistor;
a third transistor having a first passive electrode, a second passive electrode, and a control electrode, wherein the first passive electrode of the third transistor is coupled to the second passive electrode of second transistor, and wherein the control electrode of the third transistor is coupled to the delay circuit; and
a fourth transistor having a first passive electrode, a second passive electrode, and a control electrode, wherein the first passive electrode of the fourth transistor is coupled to the control electrode of the first transistor, and wherein the control electrode of the fourth transistor is coupled to the sampling switch, and wherein the second passive electrode of the fourth transistor is coupled to the second passive electrode of the third transistor.

8. The apparatus of claim 7, wherein the skew circuit further comprises a fifth transistor having a first passive electrode, a second passive electrode, and a control electrode, wherein the first passive electrode of the fifth transistor is coupled to the sampling switch, and wherein the control electrode of the fifth transistor is coupled to the controller so as to receive the control voltage.

9. The apparatus of claim 8, wherein the controller is a DAC

10. The apparatus of claim 8, wherein the controller is a charge pump.

11. An apparatus comprising:
a clock divider that receives a clock signal;
a plurality ADC branches that each receive an analog input signal, wherein each ADC branch includes:
a delay circuit that is coupled to the clock divider;
an ADC having:
a bootstrap circuit that is coupled to the delay circuit;
a PMOS transistor that is coupled to the bootstrap circuit;
a controller that is coupled to the bootstrap circuit to provide a control voltage to the bootstrap circuit so as to control a gate voltage of the sampling switch to adjust the impedance of the sampling switch when the sampling switch is actuated;
a sampling capacitor that is coupled to the PMOS transistor at its drain;
an output circuit that is coupled to the sampling capacitor; and
a sub-ADC that is coupled to the output circuit; and
a correction circuit that is coupled to the ADC, wherein the correction circuit adjusts the output of its ADC to correct for DC offset and gain mismatch;
a mismatch estimation circuit that is coupled to each delay circuit, each correction circuit, and each controller, wherein the mismatch estimation circuit provides a control signal to each controller to adjust for relative bandwidth mismatches between the ADC branches; and
a multiplexer that is coupled to each ADC branch,
wherein the PMOS transistor further comprises a first PMOS transistor, and wherein the bootstrap circuit further comprises:
a boost capacitor that is charged during a hold phase of the ADC;
a second PMOS transistor that is coupled to the boost capacitor at its source and the gate of the first PMOS switch at its drain;
a passgate circuit that is coupled to the delay circuit, that is coupled to the gate of the second PMOS transistor, and that receives the control voltage; and
a skew circuit that is coupled to sampling switch and that is controlled by the control voltage,
wherein the apparatus further comprises a multiplexer that is coupled to each ADC branch.

12. The apparatus of claim 11, wherein the passgate circuit further comprises:
a third PMOS transistor that is coupled to the controller at its source, the delay circuit at its gate, and the gate of the second PMOS transistor at its drain;
a first NMOS transistor that is coupled to the drain of the third PMOS transistor at its drain and the delay circuit at its gate; and
a second NMOS transistor that is coupled to the drain of the third PMOS transistor at its drain, the source of the first NMOS transistor at its source, and the gate of the first PMOS transistor at its gate.

13. The apparatus of claim 12, wherein the skew circuit further comprises a third NMOS transistor that is coupled to the gate of the first PMOS transistor at its drain and the controller at its gate.

14. The apparatus of claim 13, wherein the controller is a DAC or a charge pump.

* * * * *